United States Patent [19]

Furuta et al.

[11] Patent Number: 5,777,964
[45] Date of Patent: Jul. 7, 1998

[54] OPTICAL DISK APPARATUS

[75] Inventors: Satoshi Furuta; Toru Fujiwara, both of Kato-gun; Shigenori Yanagi, Kawasaki; Tadashi Sagawa, Higashine; Masaharu Moritsugu, Kawasaki, all of Japan

[73] Assignee: Fujitsu Limited, Kawasaki, Japan

[21] Appl. No.: 745,425

[22] Filed: Nov. 12, 1996

[30] Foreign Application Priority Data

Dec. 20, 1995 [JP] Japan ............................ 7-331509

[51] Int. Cl.$^6$ ............................................. G11B 7/00
[52] U.S. Cl. ............................. 369/54; 369/58; 369/116
[58] Field of Search ............................. 369/116, 124, 369/54, 48, 59, 53

[56] References Cited

U.S. PATENT DOCUMENTS

| | | | |
|---|---|---|---|
| 5,341,360 | 8/1994 | Johann et al. | 369/54 |
| 5,471,457 | 11/1995 | Bakx et al. | 369/116 |
| 5,530,687 | 6/1996 | Yamaguchi | 369/54 |
| 5,537,381 | 7/1996 | Fuji | 369/54 |
| 5,544,137 | 8/1996 | Ohara et al. | 369/54 |
| 5,592,451 | 1/1997 | Shikunami | 369/54 |
| 5,608,710 | 3/1997 | Minemura et al. | 369/54 |
| 5,629,913 | 5/1997 | Kaku et al. | 369/54 |

FOREIGN PATENT DOCUMENTS

| | | |
|---|---|---|
| 61-296529 | 12/1986 | Japan. |
| 62-159347 | 7/1987 | Japan. |
| 391135 | 4/1991 | Japan. |
| 4134737 | 5/1992 | Japan. |
| 4315876 | 11/1992 | Japan. |
| 7129961 | 5/1995 | Japan. |

*Primary Examiner*—Nabil Hindi
*Attorney, Agent, or Firm*—Greer, Burns & Crain, Ltd.

[57] ABSTRACT

An optical disk apparatus adapted to a mark edge recording method having a structure such that a data pattern experimentally recorded on an optical disk with one write power is reproduced plural times while changing reproducing conditions (for example, a slice level for binary-coding a reproduced analog signal) and the number of errors is calculated whenever the reproducing process is performed. The thus-structured process is repeated for using a plurality of write powers. An appropriate write power for the optical disk is determined in accordance with the obtained results of the calculations of the number of errors. In a case of a read-only optical disk, a data pattern experimentally and previously recorded on the optical disk is reproduced plural times by changing the reproducing conditions (for example, a slice level for binary-coding a reproduced analog signal), and the number of errors is calculated whenever the reproducing process is performed. In accordance with the obtained results of the calculations of the number of errors, an appropriate reproducing condition for the optical disk is determined.

11 Claims, 18 Drawing Sheets

(a) ANALOG SIGNAL
(b) BINARY SIGNAL
(c) P DATA
(d) N DATA

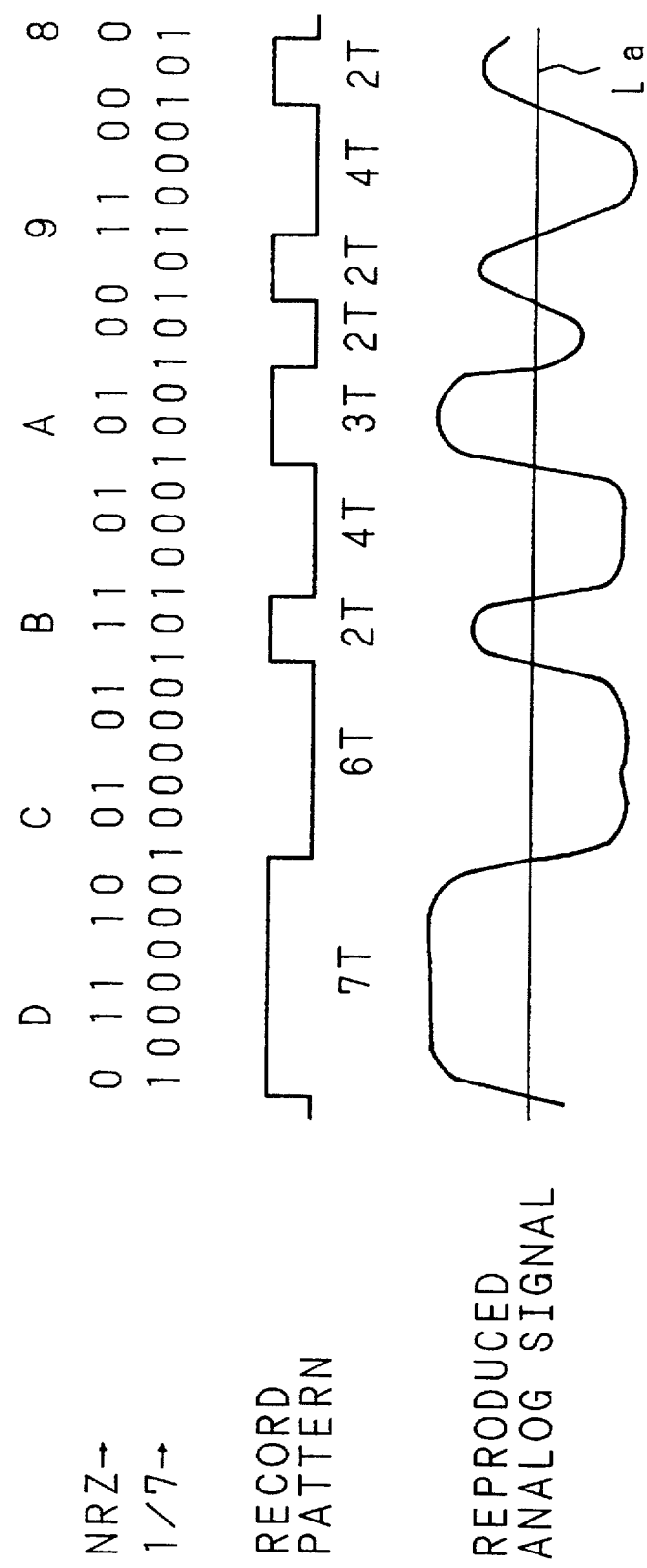

FIG. 5B
PRIOR ART

NRZ→ 0 01 00 01 00 01 00 01 00 01 00 0
1/7→ 10101010101010101010101010101

RECORD PATTERN

2T

REPRODUCED ANALOG SIGNAL

NRZ →  5    9    6    9    6    9    6    9    6    5
1/7 → 01 01 10 01 10 10 01 01 01 10 01 01 10 01 01 01
      10100000101000001010000010100000101000001010000

RECORD PATTERN 6T  1T      6T      1T      6T      1T

REPRODUCED ANALOG SIGNAL

Lc

OPTICAL DISK APPARATUS

BACKGROUND OF THE INVENTION

1. Field of the Invention

The present invention relates to an optical disk apparatus.

2. Description of Related Art

An optical disk, such as a photomagnetic disk, is adapted to a data recording method including a mark pit recording method and a mark edge recording method. Although the mark pit recording method does not encounter frequent commitment of errors because of direct recording of the NRZ code onto the optical disk ("1" indicates existence of a pit and "0" indicates no pit), it suffers from a problem in that the recording density cannot be raised because of a need to of electrically distinguish portions "1" from each other in the case where portions "1" are formed successively.

On the other hand, the mark edge recording method is a method in which the NRZ code is converted into a code (for example, 1/7 byte code) in which portions "1" are not formed successively; and the edge position of the pit is made to correspond to "1" or the portion between edges is made to correspond to "0". The mark edge recording method enables the number of "0" to be determined in accordance with the length between "1" and "1". Since the foregoing method is able to raise the recording density by raising the frequency of the operation clocks, the mark edge recording method is in a trend to be employed in place of the mark pit recording method.

However, the mark edge recording method involving the structure such that the position of each "1" and the length between "1" and "1" correspond to data intended to be recorded and that intended to be reproduced has a necessity of accurately electrically reproducing the edge positions of the recorded pits as well as the necessity of accurately reflecting the state of configuration of "1" and "0" of data intended to be recorded onto the state where data is recorded on the medium.

In a case where the mark edge recording method is performed as shown in FIG. 1 (b) such that the portion of the medium between "1" and "1" is simply irradiated with a laser beam having predetermined power (level 1), a formed domain Ds is considerably different from an ideal domain Dp, as shown in FIG. 1 (a). Therefore, a pulse train method as shown in FIG. 2 is employed.

With the pulse train method, the level of the write laser output is maintained at a considerably low assist level (level 0) as shown in FIG. 2 (c) when no pit is formed. When pits are formed, the pulses are shifted to have a relatively high level (level 1) (about ⅔ of level 2 to be described later) capable of forming pits and a long (a period which is ½ of the operation clock shown in FIG. 2 (b)) period. Then, pulses having a higher level (level 2) and a shorter period (a period which is ½ of the operation clock) are used to write data. The above-mentioned method is able to form the domain Ds having a shape approximating the ideal domain Dp as shown in FIG. 2 (a). As a result, the alignment between data intended to be recorded and the domain for recording data can be maintained.

FIG. 3 is a diagram showing an example of an optical disk apparatus employing the mark edge recording method. Light reflected from an optical disk 1 comprising a photomagnetic disk is converted into an electric signal by a photodetector provided (not shown) for an optical head 11. The electric signal obtained by conversion is amplified by an amplifier 12, and then provided with a signal envelope by a low-pass filter 13. Thus, an analog signal as shown in FIG. 4 (a) is obtained. Then, the peak level and the bottom level of the analog signal obtained from a predetermined track (or for a specific time) are confirmed, and then the obtained value is held in a peak/bottom holder 14. An intermediate value of the stored values is determined to be a slice level $L_0$.

Then, a binary circuit 15 makes portions higher than the slice level $L_0$ to be "1" and portions lower than the same to be "0", as shown in FIG. 4 (b) (that is, the analog signal is binary-coded). Then, as shown in FIGS. 4 (c) and 4 (d), dual data PDATA and NDATA denoting leading edge and trailing edges are obtained from the foregoing binary signal. By obtaining the logical sum of the dual data, reproduction data of recorded data can be obtained. Then, the obtained signal is, by a decoder 16, decoded to NRZ data required for a usual data process so as to be used.

Although the mark edge recording method is advantageous in realizing a high recording density as described above, there arises a necessity that the positions of "1" denoted by the recording signals and the intervals between "1" and "1" must be recorded and reproduced to correspond to the recording signals.

In a case where only optical disks of a predetermined type manufactured by a specific manufacturer are used, the optimum recording condition capable of preventing occurrence of errors can definitely be determined. However, the conditions of the optical disk, such as the material and the thickness of the magnetic film, are somewhat different among manufacturers. Therefore, even if the levels (levels 0 to 2) of the laser beam for use in recording data by the pulse train method are made to be the same, the state of the formed pits are somewhat different from one another in the case where the type of the optical disk is different. As a result, the optimum write condition cannot definitely be determined.

The pulse train method is required to adjust each of three levels of the laser beam in order to appropriately record data. Therefore, an appropriate write power must be set and therefore a long time is required to set the appropriate write power.

As a method of setting appropriate write power for an optical disk mounted on an optical disk apparatus, a test write method has been employed. The foregoing method comprises the steps of test-recording data on a predetermined test region of the mounted optical disk with a variety of powers; calculating the number of errors occurring in reproducing recorded data; and an optimum write power is determined in accordance with a result of the calculation above. However, since the reproducing condition is usually made to be constant in the foregoing process, a point, at which the number of errors can satisfactorily be decreased, cannot be detected precisely. Thus, there arises a problem in that a satisfactory accuracy cannot be realized in setting the appropriate write power.

A variety of methods of preventing reproduction errors by the reproducing unit have been suggested. For example, a method has been disclosed in, for example, Japanese Patent Application Laid-Open No. 3-91135, in which the amplifying ratio of the amplifying circuit and the amount of delay in the delay circuit are determined optimally in accordance with the state of reproduction. However, changes in the amplifying ratio and the amount of delay result in change in the reproduction waveform corresponding to FIG. 4 (a). Therefore, a simple attempt to decrease the number of errors by raising the amplifying ratio cannot be employed. Moreover, adjustment of the two factors, that is, the amount of delay and the amplifying ratio, causes the process to be complicated excessively.

When the slice level for use in the binary coding process is determined in the conventional structure, a middle point between the peak level and the bottom level of analog data reproduced from a specific track is obtained. In the case of data (½ data in this case) having domain portions and non-domain portions relatively uniformly distributed as shown in FIGS. 5A and 5B, the above-mentioned method of simply obtaining the middle point involves slight change in the slice levels La and Lb and capability of decreasing the number of errors. However, if a state in which the density of the domain formed portions is high is, as shown in FIG. 5C, rapidly changed to a state in which the density of the domain formed portions is low, the slice level Lc is sometimes changed. The change in the slice level causes the number of errors to be increased.

SUMMARY OF THE INVENTION

An object of the present invention is to provide an optical disk apparatus having a structure such that a process for calculating the number of errors by reproducing, under various reproducing conditions, a test pattern recorded with one write power is repeated while changing the write power so that an appropriate write power for an optical disk is accurately determined.

Another object of the present invention is to provide an optical disk apparatus having a structure such that a test pattern recorded previously is reproduced under a variety of reproducing conditions to calculate the number of errors so that an appropriate reproducing condition for an optical disk is determined in accordance with the result of the calculations.

Another object of the present invention is to provide an optical disk apparatus which is capable of setting appropriate write power and/or reproducing condition even if an arbitrary optical disk of a different type is loaded so that a disk reproducing state is always maintained while satisfactorily preventing occurrence of an error.

According to one aspect of the present invention, there is provided an optical disk apparatus, comprising: writing means for writing a specific data pattern on a predetermined region of an optical disk with various write powers; reproducing means for reproducing the written specific data pattern; reproducing condition control means for changing reproducing conditions when the specific data pattern written with respective write powers is reproduced; error number calculating means for calculating the number of errors in reproduced data under the respective reproducing conditions; and write power determining means for determining an appropriate write power for the optical disk in accordance with the calculated number of errors. The specific data pattern written on the optical disk with one write power is reproduced plural times while changing the reproducing conditions. Whenever the reproduction process is performed, the number of errors is calculated. The foregoing process is repeated with the plural write powers. In accordance with the result of the calculations of the number of errors, the appropriate write power for the optical disk is determined.

According to another aspect of the present invention, there is provided an optical disk apparatus, comprising: reproducing means for reproducing a specific data pattern written on an optical disk; reproducing condition control means for changing reproducing conditions when the specific data pattern is reproduced; error number calculating means for calculating the number of errors in reproduced data under the respective reproducing conditions; and reproducing condition determining means for determining an appropriate reproducing condition for the optical disk in accordance with the calculated number of errors. The specific data pattern, which has been previously written, is reproduced plural times while changing the reproducing conditions. Whenever the reproduction process is performed, the number of errors is calculated. In accordance with the result of the calculations of the number of errors, the appropriate reproducing condition is determined.

The reproducing conditions which are changed consist of a slice level for use when an analog signal supplied from the optical disk is binary-coded, Window Tap which is the phase difference between the analog signal supplied from the optical disk and a prepared reference clock and a boost value of an electronic filter of the reproducing means.

When, for example, the slice level is changed, a plurality of offset values are provided for a predetermined slice level when the specific data pattern is reproduced so as to change the slice level. Then, the number of errors in reproduced data is calculated at each slice level so that the total number of errors is obtained. In accordance with the total number of errors at the respective reproducing conditions, the appropriate write power and/or the appropriate reproducing condition are determined.

The above and further objects and features of the invention will more fully be apparent from the following detailed description with accompanying drawings.

BRIEF DESCRIPTION OF THE DRAWINGS

FIGS. 5A to 5C are diagrams showing the relationship among an NRZ signal, a ½ byte signal, a record pattern and a reproduced analog signal;

DESCRIPTION OF THE PREFERRED EMBODIMENTS

Preferred embodiments of the present invention will now be described with reference to the drawings.

(First Embodiment)

Figure 6:
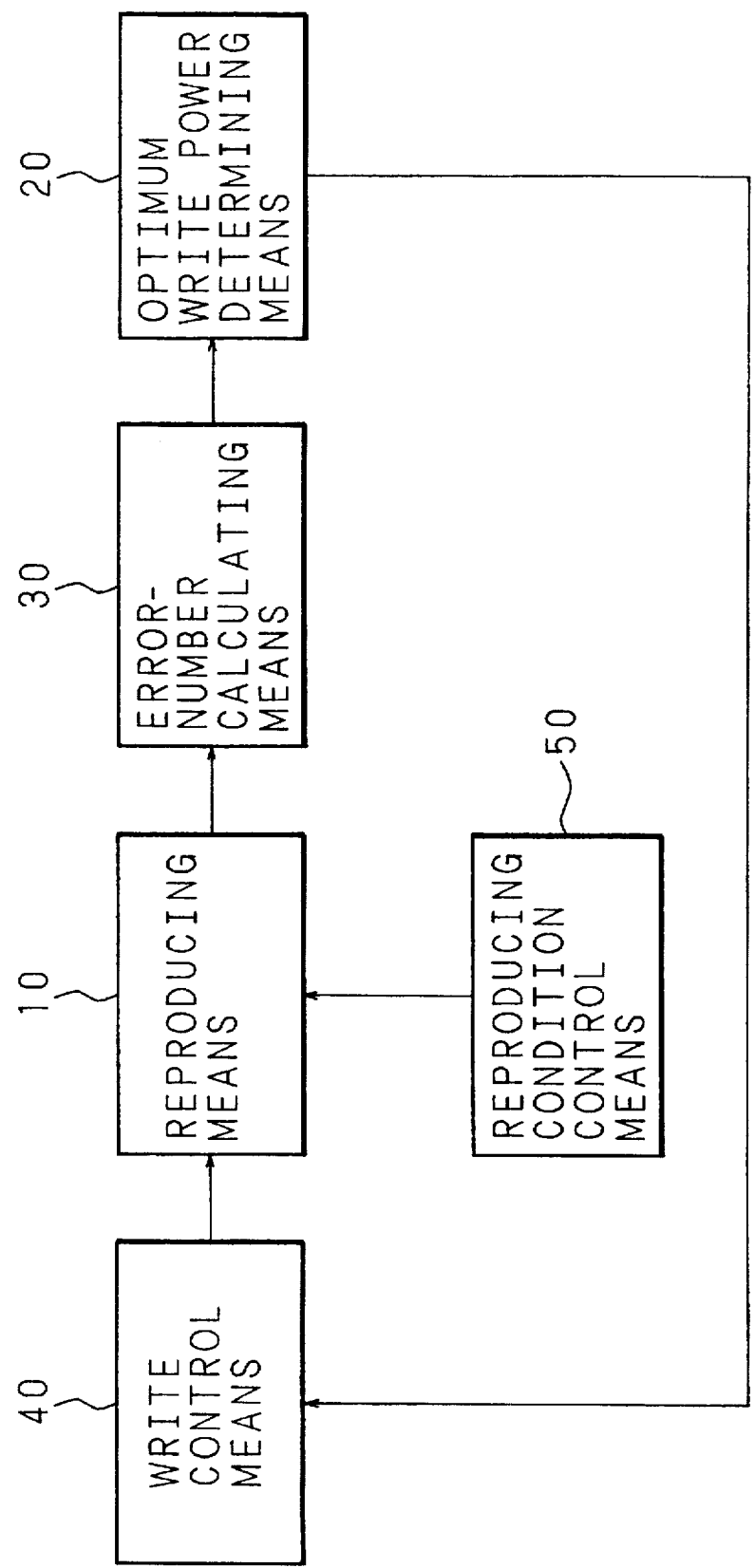
FIG. 6 is a block diagram showing the principle of an optical disk apparatus according to a first embodiment of the present invention.

An optical disk apparatus according to a first embodiment of the present invention will now be described in which an appropriate write power can be set for an optical disk. FIG. 6 is a block diagram showing the principle and structure of the first embodiment which is capable of obtaining an optimum write power. When an optical disk has been loaded onto an optical disk apparatus, a write control means 40 experimentally records a specific data pattern in a predetermined region of the optical disk with a certain write power. The recorded specific data pattern is read by a reproducing means 10. At this time, a reproducing condition control means 50 changes the reproducing condition in the reproducing means 10 so that one specific data pattern is read under a variety of reproducing conditions. Specifically, the following reproducing conditions are changed which include the slice level for use in the operation for binary-coding an analog signal from the optical disk; Window Tap which is the phase difference between the analog signal supplied from the optical disk and a prepared reference clock; and the boost value of an electronic filter (not shown) of the reproducing means 10. The number of errors occurring in the reproduced signal read under the respective reproducing conditions is calculated by a error-number calculating means 30. The result of the calculations is transmitted to an optimum write power determining means 20.

After the data pattern recorded with one write power under all of the reproducing conditions has been reproduced, the write control means 40 again records the data pattern for test with another write power. Also this data pattern is reproduced under a variety of reproducing conditions so that result of calculations in the respective reproducing conditions is obtained.

Then, the data pattern for test is recorded with still another write power to obtain result of calculations by a similar method. The foregoing process is repeated plural times. Finally, the optimum write power is determined in accordance with results of the calculations of the number of errors supplied to the optimum write power determining means 20.

Figure 7:
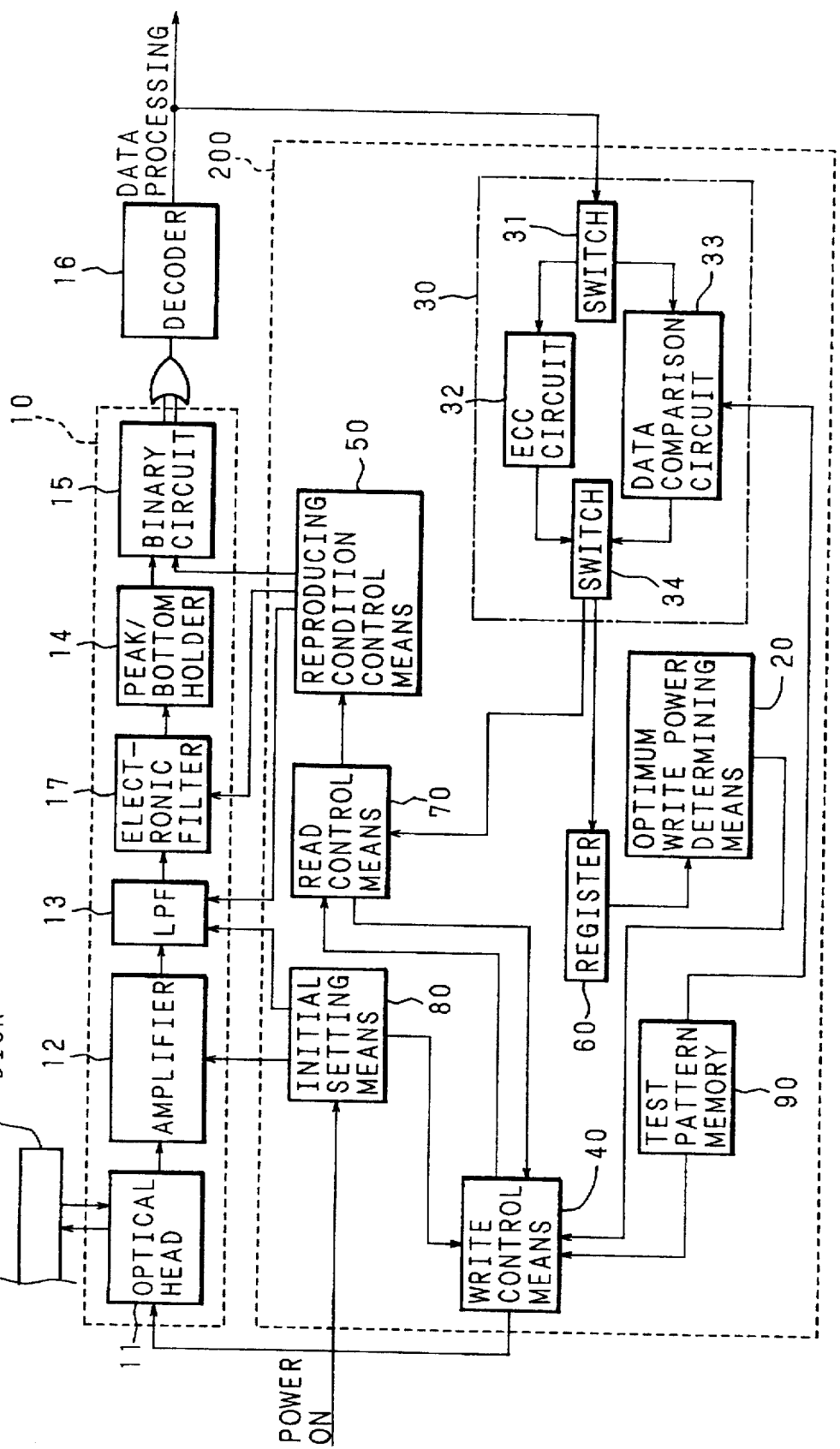
FIG. 7 is a diagram showing an example of the structure of the optical disk apparatus according to the first embodiment of the present invention.
Figure 8A:
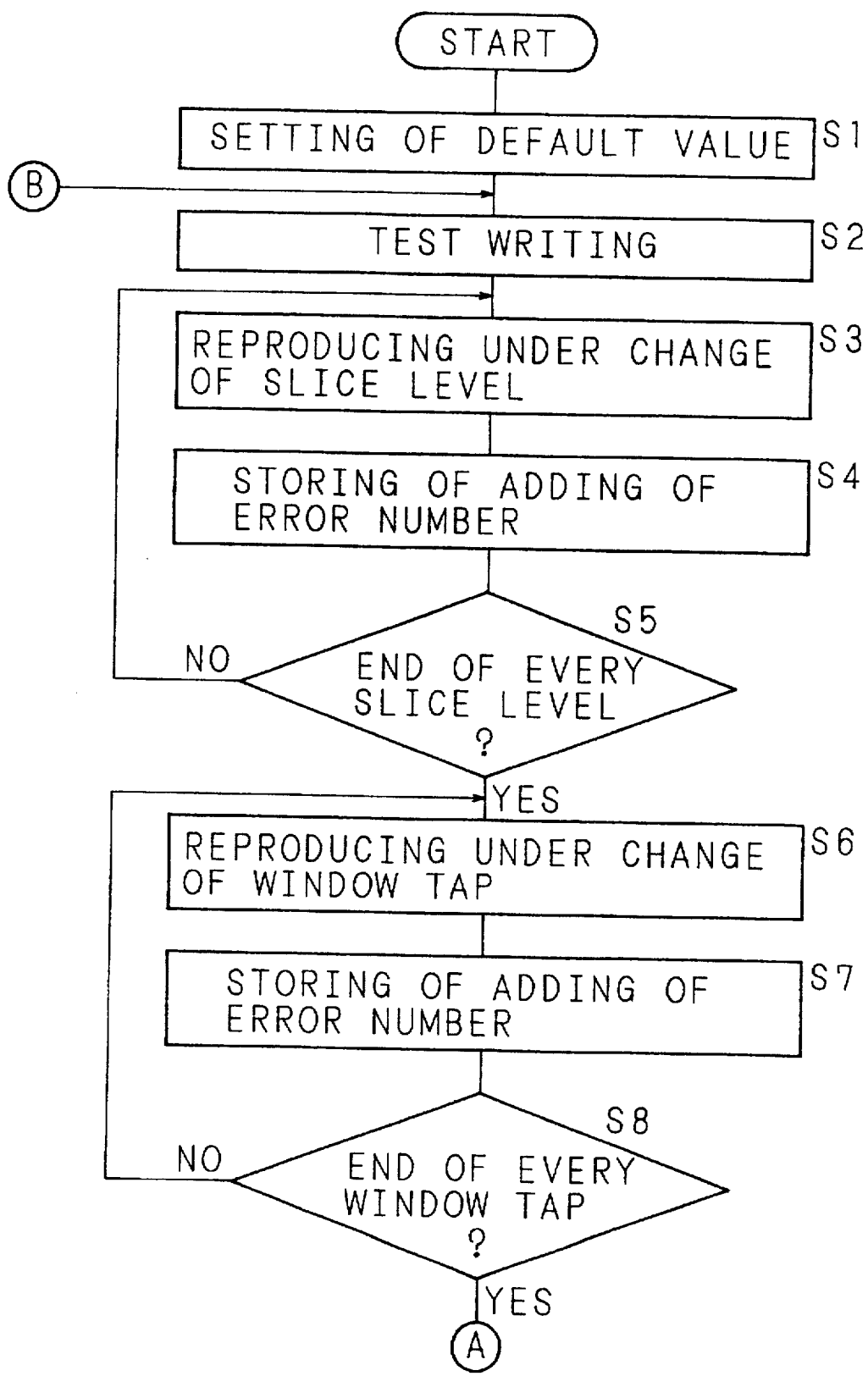
FIGS. 8A, 8B are flow charts showing the operation procedure of the optical disk apparatus according to the first embodiment of the present invention.
Figure 8B:
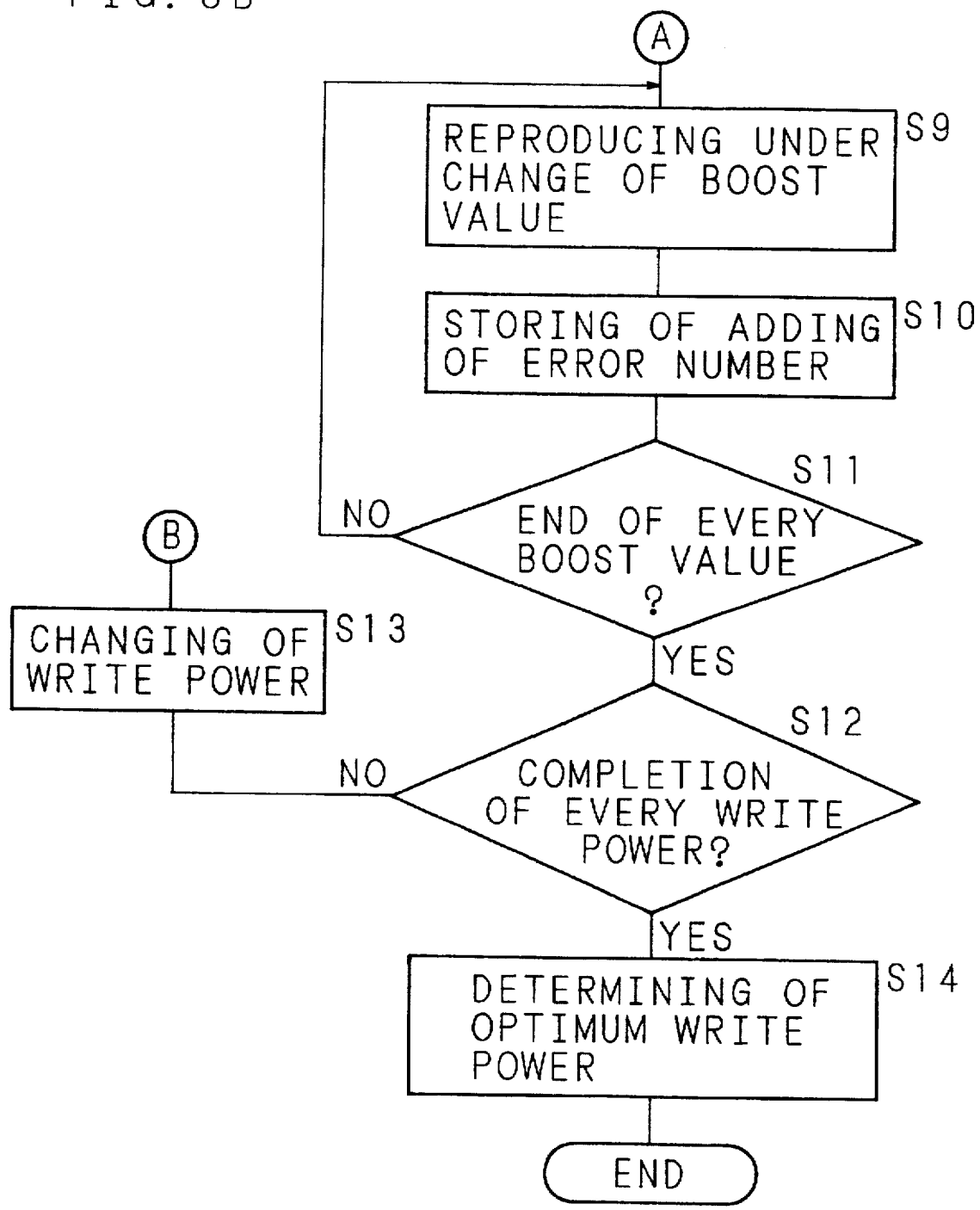

FIG. 7 is a diagram showing an example of the structure of the first embodiment. FIGS. 8A, 8B are flow charts showing the operation procedure of the first embodiment.

Figure 1:
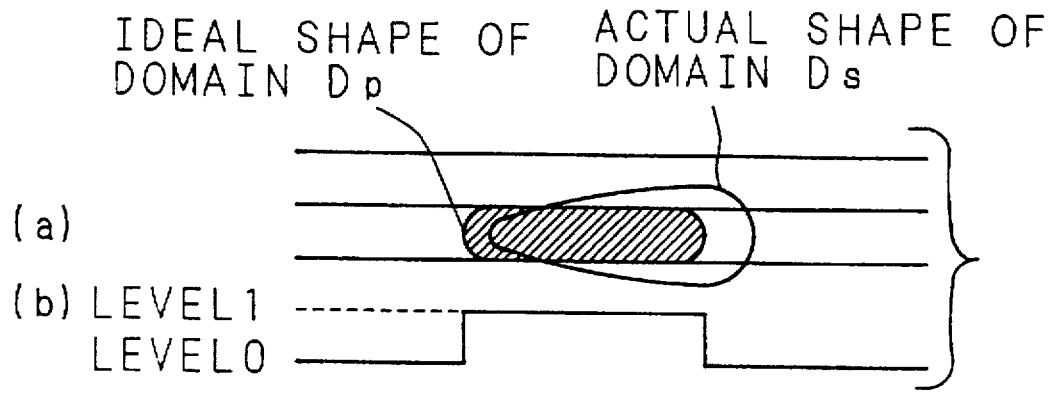
FIG. 1 is a diagram showing a record domain of an optical disk.
Figure 2:
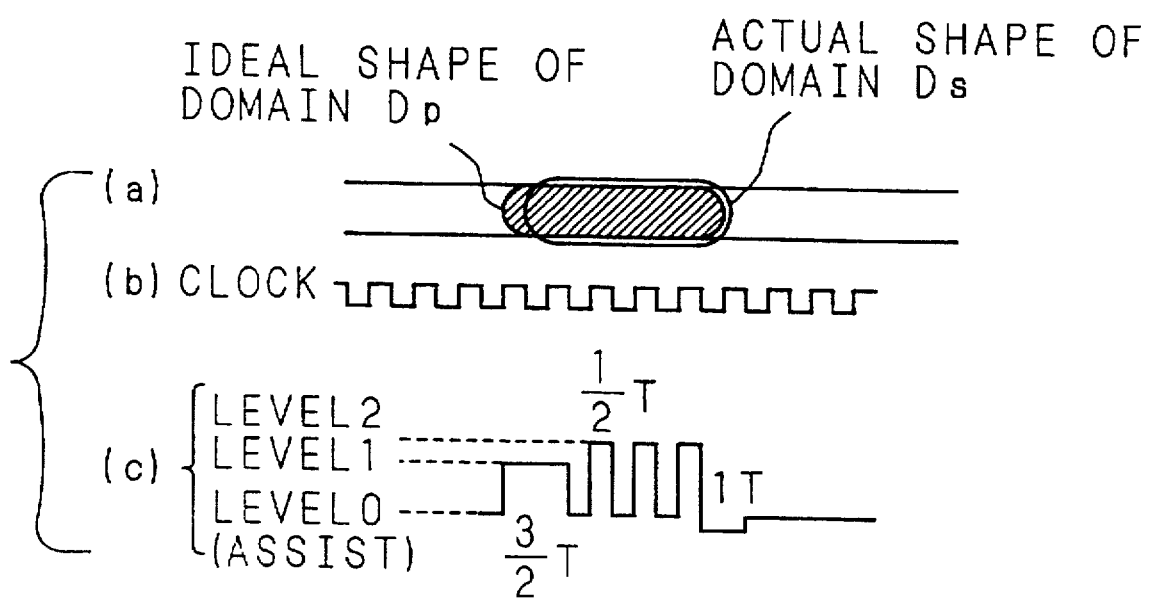
FIG. 2 is a diagram showing a record domain of the optical disk.
Figure 3:
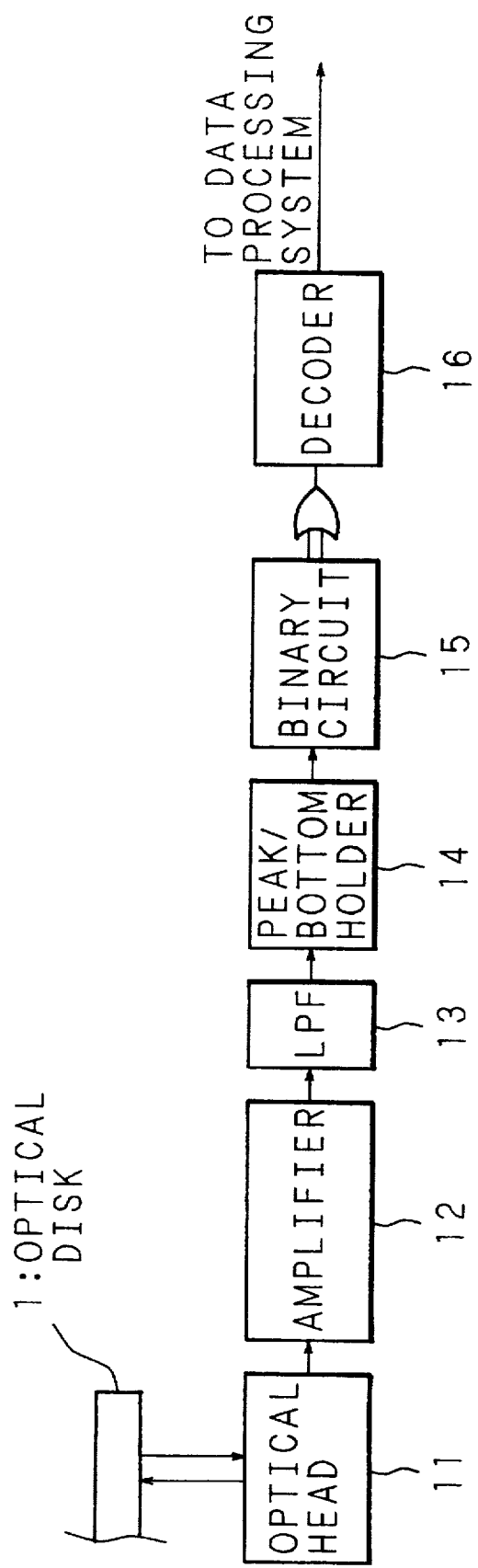
FIG. 3 is a diagram showing an example of the structure of a conventional optical disk apparatus.

When the power source is turned on, an initial setting means 80 of an MPU 200 is operated so that default values which are originally supported by the optical disk apparatus, such as the amplifying ratio of an amplifier 12 with respect to an optical disk 1 and the transmissive frequency of a low-pass filter 13, are set. As a matter of course, default values of the recording system, such as three levels consisting of assist level, level 1 and level 2 shown in FIG. 2 and the like are, together with changes of power tables of MO (Magneto Optical) and DOW (Direct Over Write), set, as well as those of the reproducing system (step S1).

Then, the write control means 40 is operated so that a specific pattern stored in a test pattern memory 90 is written on a predetermined region of the optical disk 1 (step S2). Write conditions at the foregoing write process, such as the assist level, level 1 and level 2 (see FIG. 2), are the default values. At this time, a pattern as shown in FIG. 5C with which a highest possible error occurrence rate can be realized is written.

Figure 4:
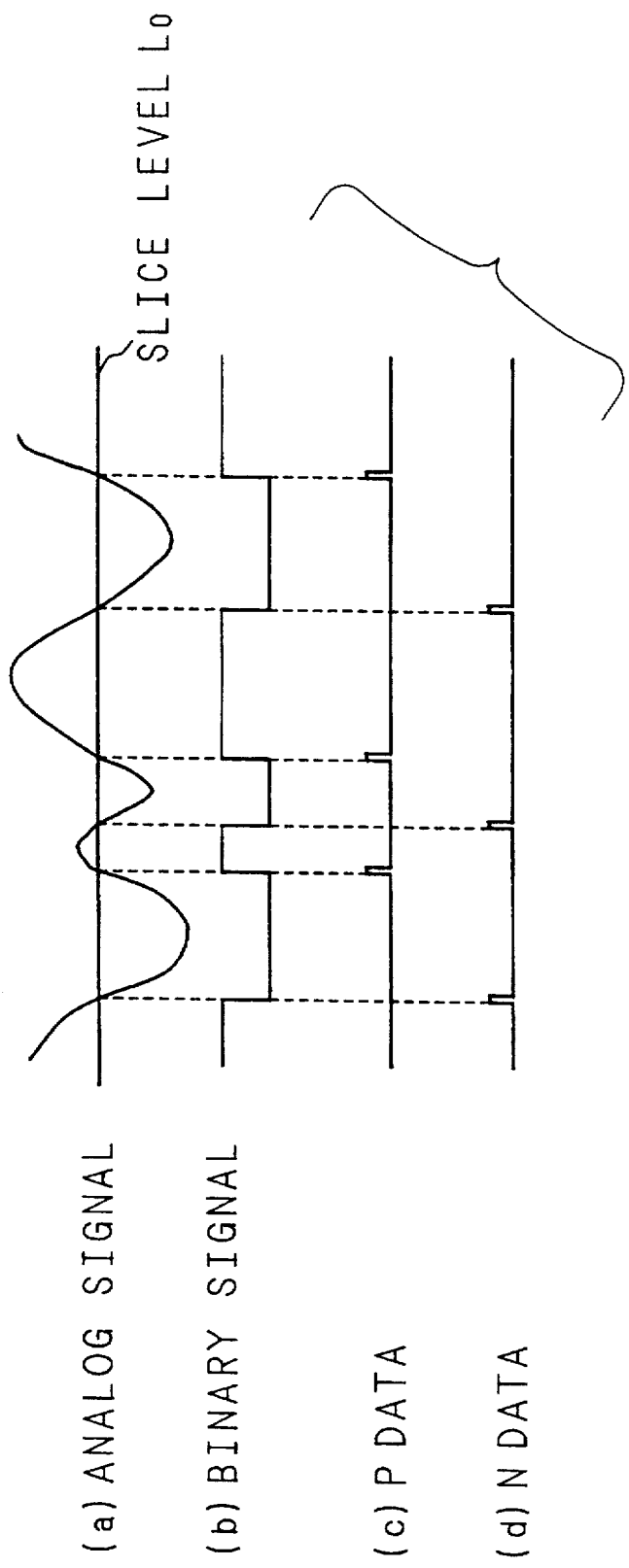
FIG. 4 is a graph showing waveforms in the units shown in FIG. 3.

After the foregoing write process has been completed, a read control means 70 is operated so that the reproducing laser of an optical head 11 is turned on. Thus, the written test pattern is reproduced. Light reflected by the optical disk 1 is, by a photodetector (not shown) provided for the optical head 11, converted into an electric signal. The electric signal obtained by the conversion above is amplified by an amplifier 12, and then allowed to pass through a low-pass filter 13 and an electronic filter 17 so that an analog reproduced signal as shown in FIG. 4 (a) is obtained. The peak and bottom levels of the analog signal are held in a peak/bottom holder 14. The analog signal is binary-coded by a binary circuit 15 with a slice level which is an intermediate value between the peak level and the bottom level so that a binary signal as shown in FIG. 4 (b) is obtained. Dual data PDATA and NDATA denoting the leading and trailing edges of the binary signal and forms as shown in FIGS. 4 (c) and 4 (d) are obtained from the binary signal above. By obtaining the logical sum of the dual data items, reproduced data of recorded data can be obtained. Then, the thus-obtained signal is, by a decoder 16, decoded into NRZ data which is required by a usual data process.

When the foregoing reproducing process is performed, the reproducing condition control means 50 of the MPU 200 is operated so that the slice level obtained in the binary process is supplied to the binary circuit 15. With the supplied slice level, data is reproduced (step S3). In accordance with the thus-obtained binary signal, the signal is converted into NRZ data by the decoder 16. The error-number calculating means 30 calculates the number of errors in the output from the decoder 16 and stores the result of calculation into a register 60 (step S4).

The error-number calculating means 30 has an ECC (Error Checking/Correction) circuit 32 and a data comparison circuit 33 which are circuits for calculating the number of errors. The error-number calculating means 30 controls switches 31 and 34 to select the circuit for use to calculate the number of errors. The data comparison circuit 33 compares the output from the decoder 16 and the test pattern previously stored in the test pattern memory 90 to each other so as to calculate the number of errors. The data comparison circuit 33 is able to detect the bit encountered an error in addition to detecting the number of errors. However, the ECC circuit 32 is able to only detect the number of errors. In the case where only the number of errors is required to be detected, the ECC circuit 32 has a higher processing speed than that of the data comparison circuit 33.

Then, the reproducing condition control means 50 changes the slice level and the number of errors is calculated by similarly reproducing the test pattern. The result of calculation is stored into the register 60 so as to be added to the previous result of calculation. Then, a similar process (reproduction of the test pattern, calculation of the number of errors, and storage and addition of the results of the calculations) is performed for all of the slice levels (steps S3, S4 and S5 are repeated) in such a manner that the slice level is changed.

After reproduction of all slice levels has been completed (step S5: YES), the reproducing condition control means 50 is operated to change Window Tap and reproduce the test pattern (step S6). Also in this case, the ECC circuit 32 or the data comparison circuit 33 in the error-number calculating means 30 is operated to calculate the number of errors and the result of calculation is stored into the register 60 (step S7). The Window Tap is further changed to similarly reproduce the test pattern so as to calculate the number of errors. The result of calculation is stored into the register 60 and then added to the previous result of calculation. Then, while changing the Window Tap, a similar process (reproduction of the test pattern, calculation of the number of errors, and storage and addition of the results of the calculations) is performed for all of the Window Tap (steps S6, S7 and S8 are repeated).

After reproduction for all Window Tap has been completed (step S8: YES), the reproducing condition control means 50 is operated so that the boost value of the electronic filter 17 is changed to reproduce the test pattern (step S9). Also in this case, the ECC circuit 32 or the data comparison circuit 33 in the error-number calculating means 30 is operated to calculate the number of errors, and the result of calculation is stored into the register 60 (step S10). The boost value is further changed to similarly reproduce the test pattern so as to calculate the number of errors. The result of calculation is stored into the register 60 and added to the previous result of calculation. Then, while changing the boost value, a similar process (reproduction of the test pattern, calculation of the number of errors, and storage and addition of the results of the calculations) is performed for all boost values (steps S9, S10 and S11 are repeated).

After the foregoing sequential reproducing processes for the test pattern recorded with certain write power under all of the reproducing conditions have been completed (step S11: YES:), whether processes of the test pattern with all of the write powers have been completed is determined (step S12).

If the processes have not been completed, signal denoting this is transmitted from the read control means 70 to the write control means 40 so that the write control means 40 is operated and the write power is changed to a level different from that in the previous process (step S13). Then, the specific pattern stored in the test pattern memory 90 is again written on a predetermined region of the optical disk 1 (step S2). Then, the foregoing test pattern is subjected to a similar reproduction process (steps S3 to S11).

A sequence of processes of the test pattern recorded with all of the write powers (for example, five kinds of powers) has been completed (step S12: YES), the optimum write power determining means 20 reads the added number of errors stored in the register 60 and determines the write power with which the smallest added value is obtained as optimum write power (step S14).

A case will now be considered in which the slice level is changed. The result is obtained such that number of errors at a plurality of slice levels with one write power is obtained, that is, the total number of errors is large with certain write power and the total number of errors is small with another write power level. It can be said that the write power with which the number of errors is not changed considerably if the slice level is changed is an appropriate level and that the write power with which the number of errors deteriorates if the slice level is changed slightly is unsatisfactory. Therefore, the total number of errors at a plurality of slice levels can be employed as an index when appropriate write power is determined.

Although the procedure for changing the three reproducing condition including the slice level, Window Tap and the boost value has been described in the foregoing embodiment, only one or two reproducing conditions may, of course, be changed.

Although the sequential reproduing process is performed with a plurality of write powers, appropriate write power can be determined if a test pattern recorded with one write power is subjected to a similar process. Since the first embodiment enables the result of the calculations of the number of errors with one write power to be obtained, considerably appropriate write power can be determined in accordance with the result of the calculations and the one write power.

As described above, the first embodiment has the structure such that a test pattern recorded with one write power or plural write powers is subjected to the reproducing process under the plural reproducing conditions. Therefore, appropriate write power for an arbitrary optical disk can accurately be set. As a result, the recording and reproducing operations of an optical disk apparatus adapted to the mark edge recording method requiring appropriate and accurate write power can accurately be performed.

(Second Embodiment)

An optical disk apparatus according to a second embodiment of the present invention which is capable of setting an appropriate reproducing condition for an optical disk will now be described. A structure for setting an appropriate slice level for a binary-coding process with respect to an optical disk will now be described in which a slice level for use in binary-coding an analog signal obtained from the optical disk is employed as the reproducing condition which is changed when a test pattern is reproduced.

Figure 9:
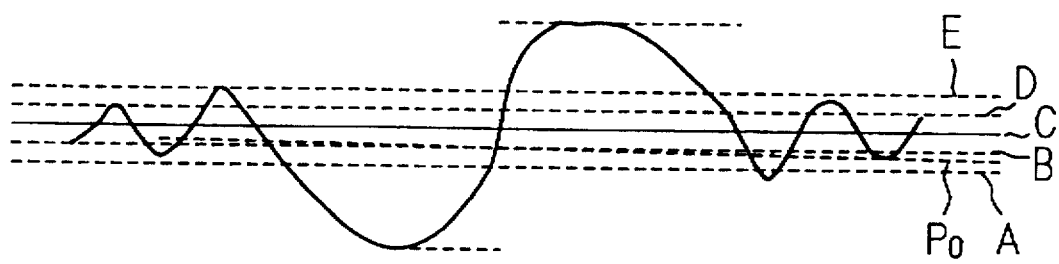
FIG. 9 is a graph showing the relationship between the reproduced analog signal and a slice level.
Figure 10:
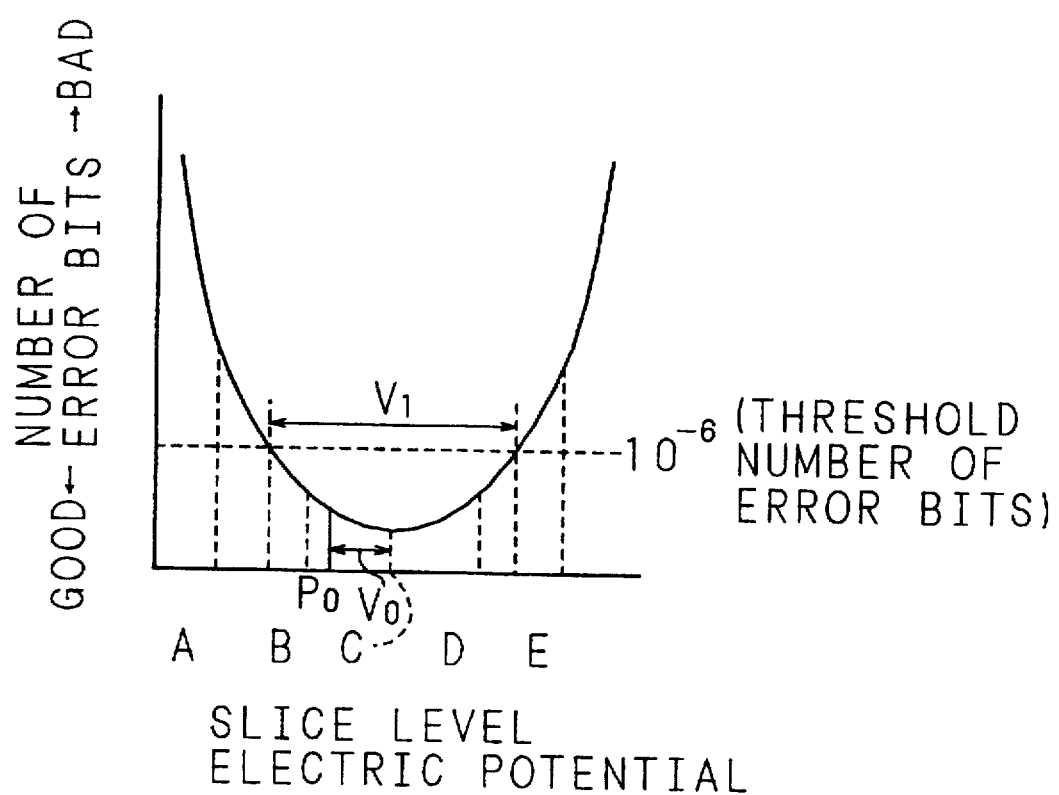
FIG. 10 is a graph showing the relationship between the number of errors and the slice level.

In general, the number of errors occurring when a analog reproduced signal supplied from an optical disk is, as shown in FIG. 9, sliced with levels A, B, C, D and E forms a parabola as shown in FIG. 10. It is ideal to determine the slice level at the leading end of the parabola in such a manner that the number of errors is smaller than $10^{-6}$. The ideal slice level does not always coincide with the middle point of the peak level and the bottom level of the reproduced signal. Therefore, optimum slice level C must be realized by adding offset of correction value $V_0$ when the middle point between the peak level and the bottom level is $P_0$.

Figure 11:
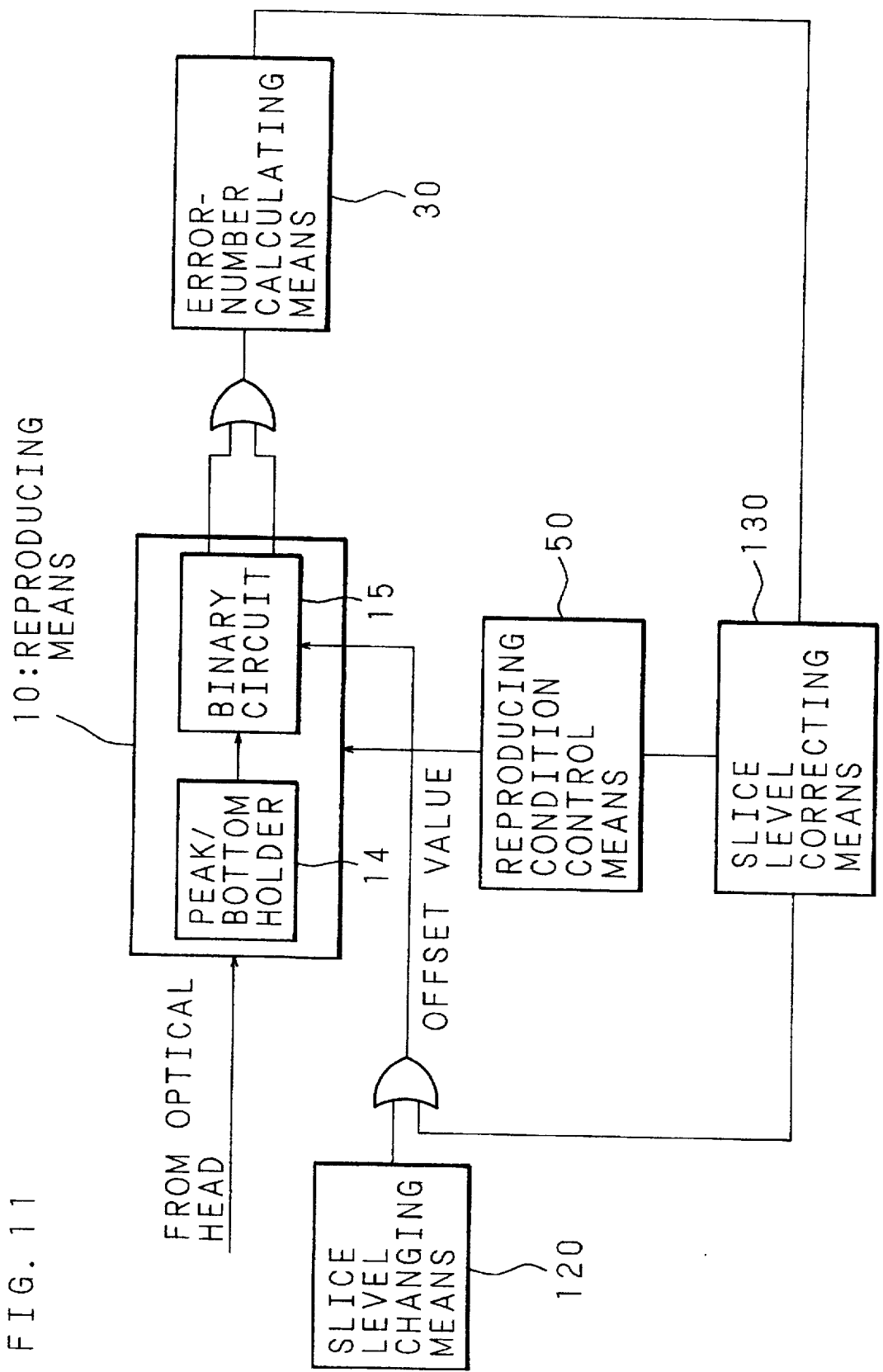
FIG. 11 is a block diagram showing the principle of an optical disk apparatus according to a second embodiment of the present invention.

FIG. 11 is a block diagram showing the principle and structure of a second embodiment for obtaining the optimum slice level C. The binary circuit 15 of the reproducing means 10 is supplied with an analog reproduced signal and the middle point between the peak level and the bottom level of the analog reproduced signal, the middle point being supplied as the slice level. A slice level changing means 120 supplies, to the binary circuit 15, an offset value for changing the slice level into a plurality of levels. The plural slice levels are used to read a predetermined specific pattern of the optical disk.

The error-number calculating means 30 calculates the number of errors in the reproduced and demodulated signal read with each slice level. A slice level correcting means 130 obtains upper and lower limits of the slice level with which the number of errors is made to be smaller than an allowable value in accordance with the calculated number of errors, and then determines the middle point of the upper and lower limits to be the optimum slice level. When the optimum slice level has been determined, a correction value (an offset value) for the slice level (the middle point between the peak level and the bottom level) supplied from the peak/bottom holder 14 corresponding to the optimum slice level can be determined. The offset value is supplied to the binary circuit 15.

When margin of the upper and lower limits of the slice level with which the number of errors is made to be smaller than an allowable value are wide, the optimum slice level can easily be determined by narrowing the margin. Therefore, the reproducing condition control means 50 changes the transmissive frequency of a low-pass filter (not shown) of the reproducing means 10 and/or the boost value of an electronic filter (not shown) of the reproducing means 10 is changed to intentionally form a reproduced signal having a large number of errors. Then, the margin is narrowed so that the optimum slice level is easily determined.

Figure 12:
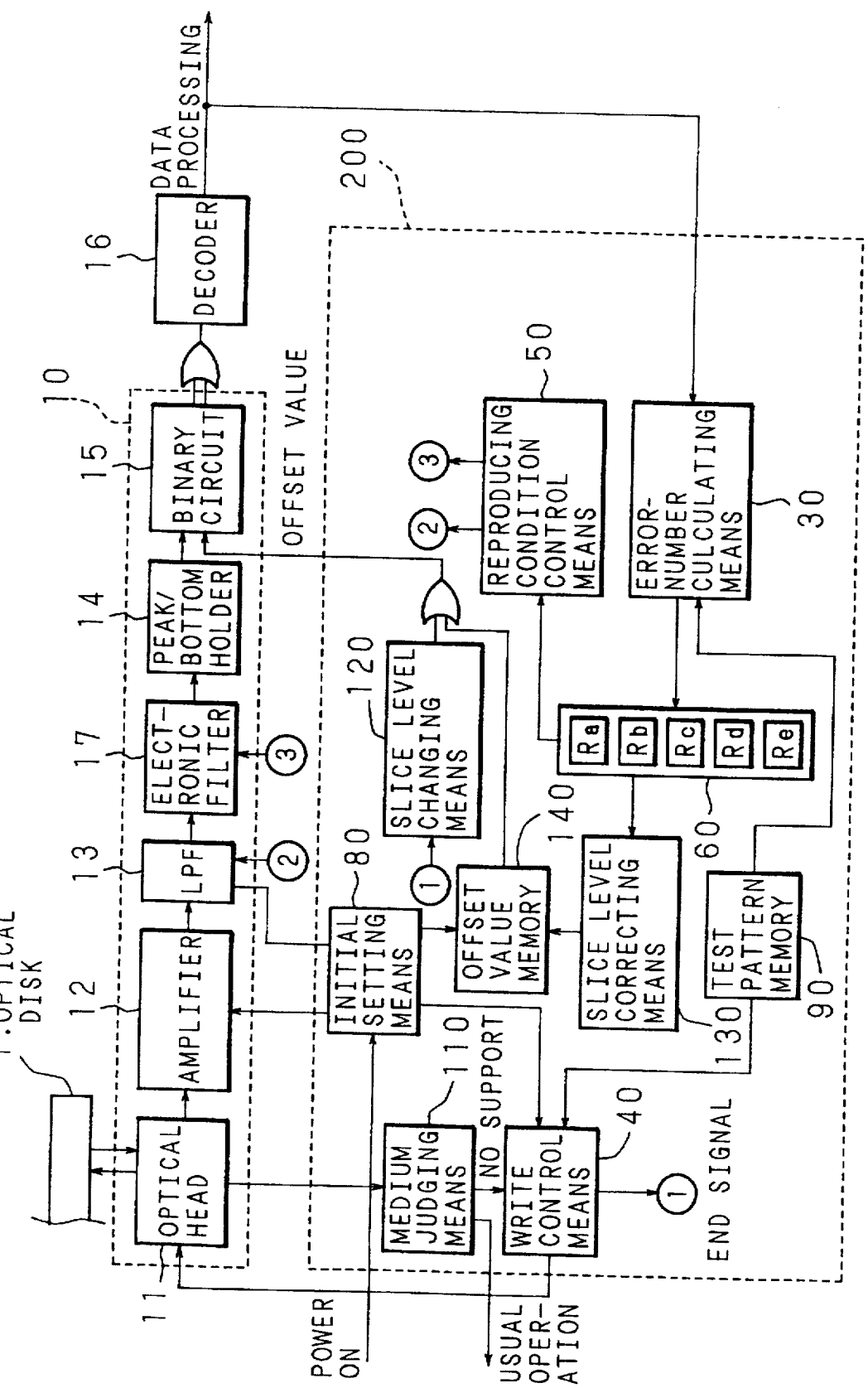
FIG. 12 is a diagram showing an example of the structure of the optical disk apparatus according to the second embodiment of the present invention.
Figure 13A:
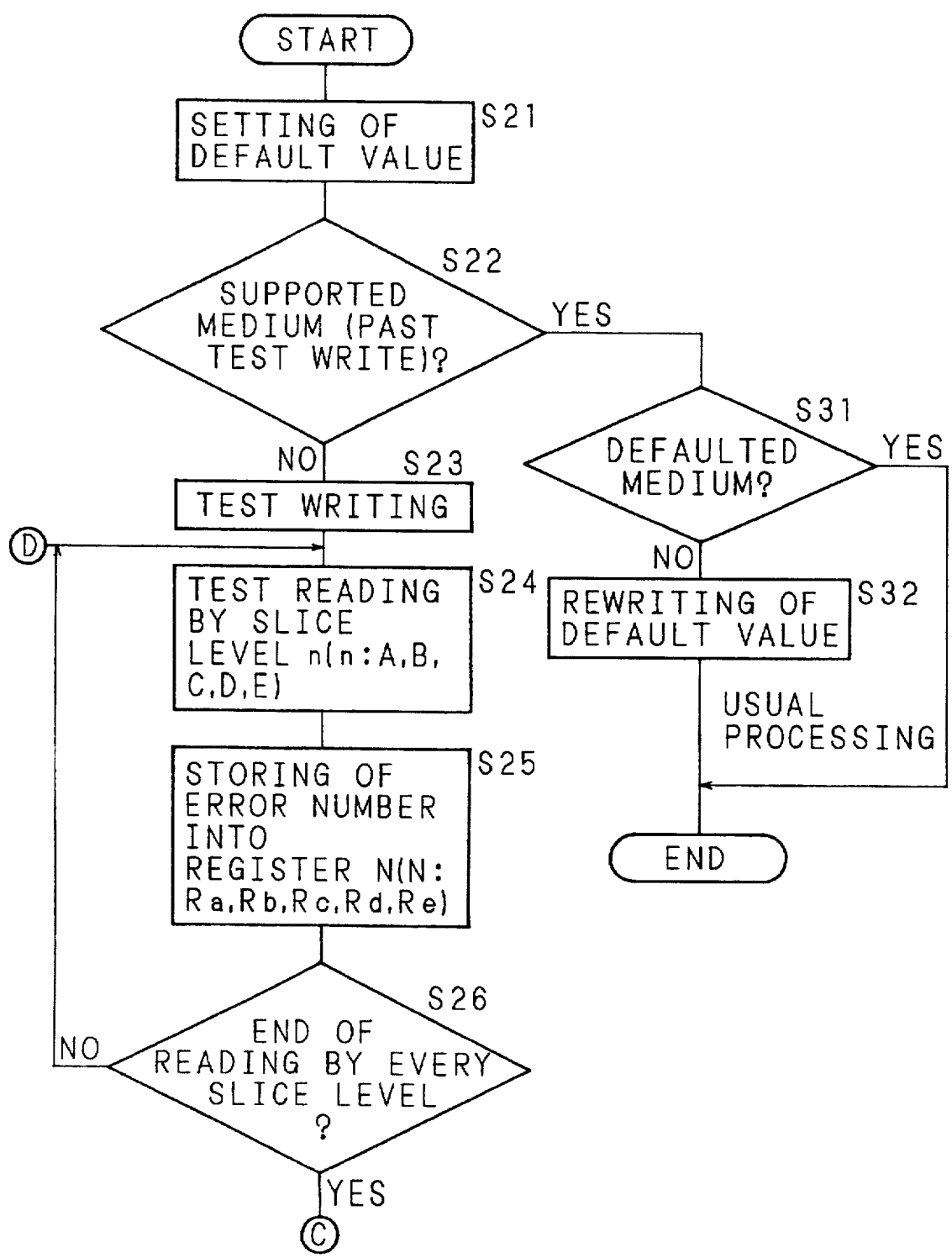
FIGS. 13A, 13B are flow charts showing the operation procedure of the optical disk apparatus according to the second embodiment of the present invention.
Figure 13B:
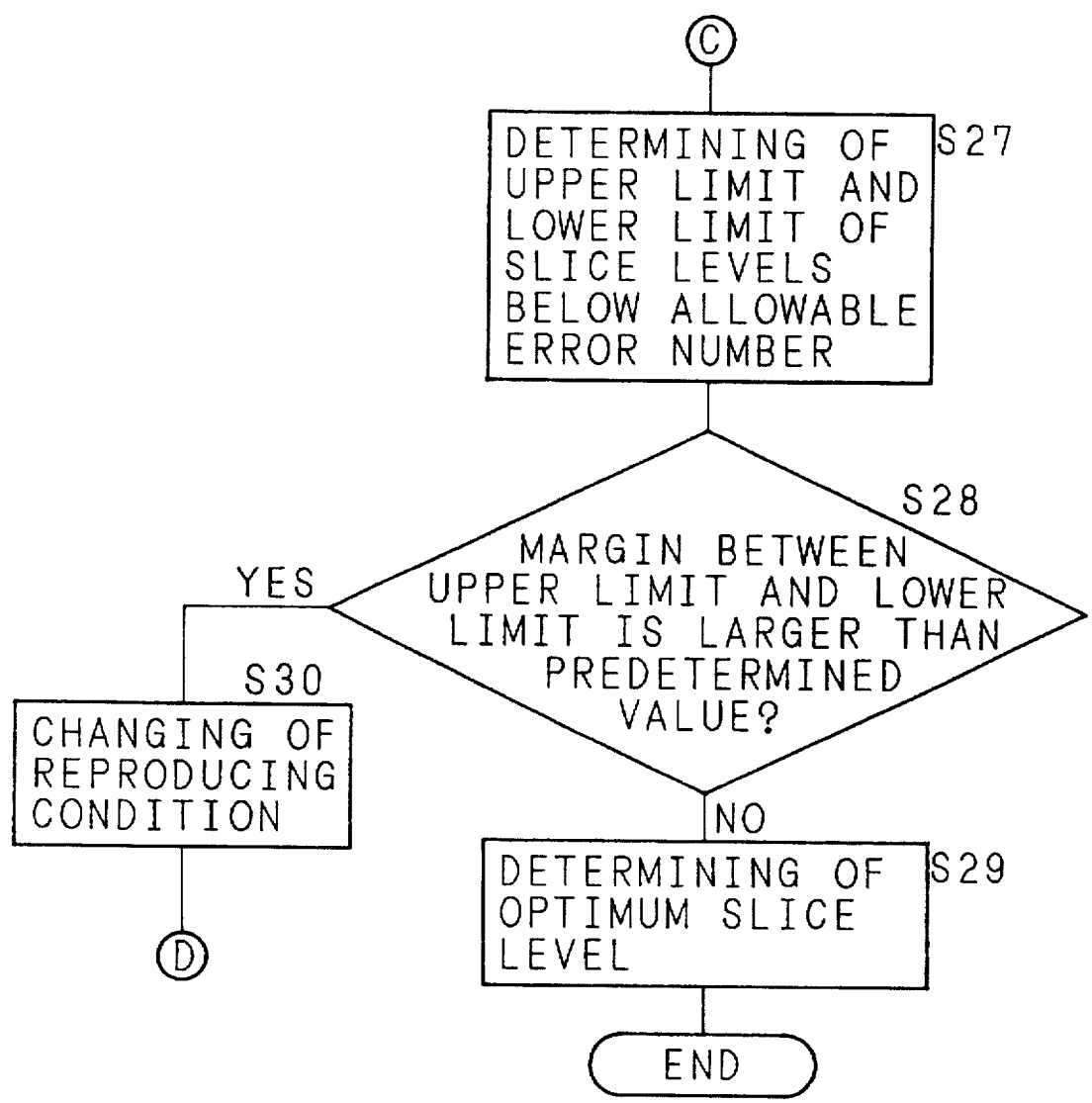

FIG. 12 is a diagram showing an example of the structure of the second embodiment. FIGS. 13A, 13B are flow charts showing the operation of the second embodiment. Referring to FIG. 12, elements given the same reference numerals are similar elements. Also the error-number calculating means 30 according to the second embodiment shown in FIG. 12 has the ECC circuit 32, the data comparison circuit 33 and switches 31 and 34 shown in FIG. 7.

When the power source is turned on, the initial setting means 80 of the MPU 200 is operated so that default values, such as the amplifying ratio of the amplifier 12 corresponding to the optical disk 1 originally adapted to the optical disk apparatus and the transmissive frequency of the low-pass filter 13 and the like, are set. As a matter of course, default values of the recording system, as well as those of the reproducing system, such as three levels consisting of assist level, level 1 and level 2 shown in FIG. 2 and the like are set (step S21).

When the optical disk 1 has been loaded onto the optical disk apparatus, a medium judging means 110 determines whether the loaded optical disk is an optical disk supported by the optical disk apparatus (step S22). If the optical disk apparatus supports the optical disk 1 (step S22: YES) and the optical disk 1 is a disk, the default values of which have been set in step S21 (step S31: YES), recording and reproducing are performed in accordance with the set default values.

In a case where the optical disk is not supported, the write control means 40 is operated so that a specific pattern stored in the test pattern memory 90 is written on a predetermined region of the optical disk 1 (step S23). Write conditions, such as the assist level, level 1, level 2 (see FIG. 2) and the like for use in the write operation are the default values. At this time, a pattern having the highest possible error commitment ratio as shown in FIG. 5C is written.

After the foregoing write operation has been completed, a reproduction control means (not shown) is operated so that the reproducing laser of the optical head 11 is turned on so that the written test pattern is reproduced. The operation of each circuit in the reproducing means 10 is performed similarly to those of the first embodiment so that a middle point between the peak level and the bottom level of the analog reproduced signal is supplied from the peak/bottom holder 14 to the binary circuit 15 as the slice level.

When the foregoing reproducing operation is performed, the slice level changing means 120 of the MPU 200 is operated so that an offset value for making the slice level supplied from the peak/bottom holder 14 to be, for example, level A shown in FIG. 9 is supplied to the binary circuit 15. Then, reproduction is performed with the slice level A (step S24). The thus-obtained binary signal is converted into dual data shown in FIGS. 4 (c) and 4 (d), and then, by the decoder 16, converted into NRZ data required to perform an information process.

The error-number calculating means 30, similarly to the first embodiment, calculates the number of errors Era in accordance with an output from the decoder 16, and then stores, together with the slice level A, the result of the calculation into a register Ra (step S25). Then, slice level B higher than the level A is used to calculate the number of errors Erb which is stored into a register Rb. As described above, while sequentially raising the slice level as A→B→C→D→E, the numbers of erros Era, Erb, Erc, Erd and Ere with the corresponding slice levels are sequentially stored into registers Ra, Rb, Rc, Rd and Re (steps S24, S25 and S26 are repeated in this sequential order).

Then, the slice level correcting means 130 compares the number of errors stored in the registers Ra to Re with one another to determine upper and lower limits of the slice level with which the number of errors is made to be a value smaller than an allowable value (step S27). Then, the slice level correcting means 130 determines whether the margin between the determined upper and lower limits is larger than a predetermined value (step S28).

If the margin is not larger than the predetermined value, an intermediate level between the upper and lower limits is set to be the optimum slice level, and then a correction value for making the slice level (a middle point between the peak level and the bottom level) transmitted from the peak/bottom holder 14 to be the optimum slice level is, as the offset value, stored into an offset value memory 140 (step S29). As a result, the optimum slice level can be obtained. Thus, reproduction is always performed with the slice level obtained by setting off the slice level (the middle point between the peak level and the bottom level) transmitted from the peak/bottom holder 14 with the foregoing correction value when following usual reproduction operations are performed.

If the margin is larger than the predetermined value in step S28, the reproducing condition is changed to widen the margin (step S30). Even if a pattern causing the error commitment ratio to be raised is used, the actual number of errors is made to be different depending upon the type of the medium. Therefore, in a case of a curve shown in FIG. 10, the margin (refer to $V_1$ shown in FIG. 10) between the upper and lower limits of the slice level is different depending upon the medium. If the margin is wide, the curve is made to be too gentle to easily determine the central level. Therefore, if the margin is too wide, the reproducing condition control means 50 may make the set value of, for example, the electronic filter 17 to be variable so as to change the boost value and so as to change the transmissive frequency for the low-pass filter 13 in place of changing the boost value of the electronic filter 17.

When the slice level and the other read conditions for an optical disk of a specific type have been determined, these conditions are, together with the type of the optical disk, stored into the storage means so as to be used as the judging conditions for use by the medium judging means 110. If the optimum slice level has been determined because of a previous experimental write (step S22: YES) and the optical disk is not an optical disk, the default values of which have not been set (step S31: NO), the default values written in step S21 are rewritten (step S32). Then, a usual process is performed.

If the foregoing calculation of the number of errors and the determination of the correction value (the offset value) are performed in accordance with calculation of number of errors performed plural times, more accurate reproduction can be performed. Although the optimum slice level is made to be an intermediate value between the upper and lower limits of the slice level which is lower than an allowable level, the changing pitch to the slice level by the slice level changing means 120 may be more reduced to obtain the slice level corresponding to the smallest number of errors indicated by the curve shown in FIG. 10.

As described above, the second embodiment has the structure such that the slice level with respect to the analog reproduced signal is determined by correcting the middle point between the peak level and the bottom level of the reproduced signal in such a manner that the number of errors is made to be smallest when an optical disk is reproduced. Moreover, the determination of the slice level is performed for each type of the optical disk. As a result, even if an optical disk of a different type is used, reproduction can always be performed in such a manner that errors commitment can be prevented satisfactorily.

Although the foregoing embodiment has been structured such that the number of errors is calculated while changing the slice level when the test pattern is reproduced, the reproducing condition for the change may be similar to the first embodiment in which Window Tap or the boost value of the electronic filter are changed as well as the slice level. Although the description has been performed about determination of an appropriate slice level for use in the binary-coding process which is performed when reproduction is performed, the foregoing structure is an example. As a matter of course, another appropriate reproducing condition, such as appropriate read power to be employed in the reproduction process, can be determined similarly.

Figure 14:
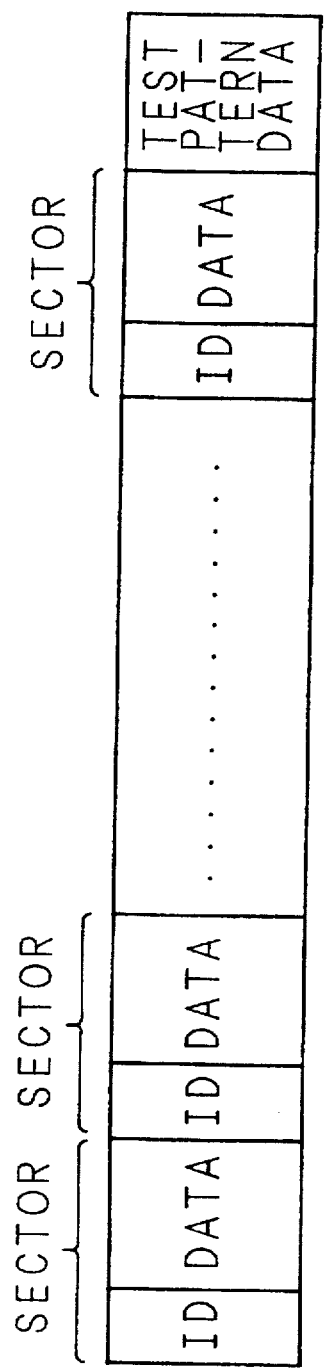
FIG. 14 is a diagram showing a format of the optical disk according to the present invention.

Although the foregoing embodiment has the structure such that the specific test pattern is temporarily written on a predetermined region of the optical disk 1, the foregoing process for determining the appropriate reproducing condition may be performed for a read-only optical disk. In the foregoing case, a specific data pattern is previously recorded in the test write region of the read-only optical disk. FIG. 14 is a diagram showing a record format of the read-only optical disk for one zone in which a test write region having a specific test pattern recorded previously is provided in the rear of plural sectors consisting of an ID region and a data region.

Although the first embodiment may be structured such that the slice level changing means 120 and the offset value memory 140 are provided similarly to the second embodiment so as to provide a plurality of offset values for a predetermined slice level in order to set plural slice levels.

Although the first embodiment has the structure such that judgment whether a loaded optical disk is a supported optical disk is not performed when the optical disk has been loaded, the medium judging means 110 may be provided similarly to the second embodiment to perform the process (steps S22, S31 and S32 shown in FIG. 13A) for judging whether the loaded optical disk is supported or not.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims or equivalence of such metes and bounds thereof are therefore intended to be embraced by the claims.

What is claimed is:

1. An optical disk apparatus, comprising:
    writing means for writing a specific data pattern on a predetermined region of an optical disk with various write powers;
    reproducing means for reproducing the written specific data pattern;
    reproducing condition control means for changing reproducing conditions when the specific data pattern written with respective write powers is reproduced;
    error number calculating means for calculating the number of errors in reproduced data under the respective reproducing conditions; and
    write power determining means for determining an appropriate write power for the optical disk in accordance with the calculated number of errors;
    wherein the reproducing conditions to be changed are at least one condition selected from a group consisting of a slice level for use when an analog signal supplied from the optical disk is binary-coded, a Window Tap which is the phase difference between the analog signal supplied from the optical disk and a prepared reference clock, and a boost value of an electronic filter of said reproducing means.

2. An optical disk apparatus according to claim 1, wherein said error number calculating means calculates the number of errors by an ECC (Error Checking/Correction) circuit.

3. An optical disk apparatus according to claim 1, wherein said error number calculating means calculates the number of errors by comparing reproduced data and the specific data pattern to each other.

4. An optical disk apparatus according to claim 1, wherein said write power determining means determines the appropriate write power in accordance with the total number of errors in the respective reproducing conditions.

5. An optical disk apparatus according to claim 4, wherein said write power determining means determines the write power with which the smallest number of errors has been committed as the appropriate write power.

6. An optical disk apparatus, comprising:
    writing means for writing a specific data pattern on a predetermined region of an optical disk;
    reproducing means for reproducing the written specific data pattern;
    reproducing condition control means for changing reproducing conditions when the written specific data pattern is reproduced;
    error number calculating means for calculating the number of errors in reproduced data under the respective reproducing conditions; and
    write power determining means for determining an appropriate write power for the optical disk in accordance with the calculated number of errors;
    wherein the reproducing conditions to be changed are at least one condition selected from a group consisting of a slice level for use when an analog signal supplied from the optical disk is binary-coded, a Window Tap which is the phase difference between the analog signal supplied from the optical disk and a prepared reference clock, and a boost value of an electronic filter of said reproducing means.

7. An optical disk apparatus, comprising:
    reproducing means for reproducing a specific data pattern written on an optical disk;
    reproducing condition control means for changing reproducing conditions when the specific data pattern is reproduced;
    error number calculating means for calculating the number of errors in reproduced data under the respective reproducing conditions; and
    reproducing condition determining means for determining an appropriate reproducing condition for the optical disk in accordance with the calculated number of errors;
    wherein the reproducing conditions to be changed are at least one condition selected from a group consisting of a slice level for use when an analog signal supplied from the optical disk is binary-coded, a Window Tap which is the phase difference between the analog signal supplied from the optical disk and a prepared reference clock, and a boost value of an electronic filter of said reproducing means.

8. An optical disk apparatus according to claim 7, wherein said error number calculating means calculates the number of errors by an ECC (Error Checking/Correction) circuit.

9. An optical disk apparatus according to claim 7, wherein said error number calculating means calculates the number of errors by comparing reproduced data and the specific data pattern to each other.

10. An optical disk for use in an optical disk apparatus including a writing means for writing data on the optical disk with various write powers, a reproducing means for reproducing the written data, a reproducing condition control means for changing reproducing conditions, an error number calculating means for calculating the number of errors in reproduced data under the respective reproducing conditions, and a write power determining means for determining an appropriate write power for the optical disk in accordance with the calculated number of errors, comprising:

a specific data pattern recorded by said writing means on a predetermined region of the optical disk, wherein said reproducing conditions control means changes the reproducing conditions when said specific data pattern is reproduced with respective said write powers, and wherein said error number calculating means and said write power determining means determines a desired reproducing condition from said reproduction of said specific data pattern, wherein said desired reproducing condition can be determined by changing at least one condition selected from a group consisting of a slice level for use when an analog signal supplied from the optical disk is binary-coded, a Window Tap which is the phase difference between an analog signal supplied from the optical disk and a prepared reference clock, and a boost value of an electronic filter of said reproducing means.

11. An optical disk for use in an optical disk apparatus including a reproducing means for reproducing data written on the optical disk, a reproducing condition control means for changing reproducing conditions, an error number calculating means for calculating the number of errors in reproduced data under the respective reproducing conditions, and a reproducing condition determining means for determining a desired reproducing condition for the optical disk, comprising:

a specific data pattern recorded on a predetermined region of the optical disk, wherein said reproducing condition control means changes the reproducing conditions when said specific data pattern is reproduced by said reproducing means, and wherein said reproducing condition determining means determines said desired reproducing condition in accordance with said number of errors calculated by said error number calculating means, wherein said desired reproducing condition can be determined by changing at least one condition selected from a group consisting of a slice level for use when an analog signal supplied from the optical disk is binary-coded, a Window Tap which is the phase difference between an analog signal supplied from the optical disk and a prepared reference clock, and a boost value of an electronic filter of said reproducing means.

* * * * *